United States Patent
Dave et al.

(10) Patent No.: US 8,516,333 B1
(45) Date of Patent: Aug. 20, 2013

(54) PRE-INTERLEAVING FOR FORWARD ERROR CORRECTION CODES

(75) Inventors: Sameep Dave, Stow, OH (US); Fan Mo, Stow, OH (US)

(73) Assignee: ViaSat, Inc., Carlsbad, CA (US)

( * ) Notice: Subject to any disclaimer, the term of this patent is extended or adjusted under 35 U.S.C. 154(b) by 289 days.

(21) Appl. No.: 12/950,318

(22) Filed: Nov. 19, 2010

Related U.S. Application Data

(60) Provisional application No. 61/262,658, filed on Nov. 19, 2009.

(51) Int. Cl.
*H03M 13/00* (2006.01)

(52) U.S. Cl.
USPC ............ 714/755; 714/774; 714/782; 714/788

(58) Field of Classification Search
USPC .......................... 714/755, 782, 762, 788, 774
See application file for complete search history.

(56) References Cited

U.S. PATENT DOCUMENTS

| | | | | |
|---|---|---|---|---|
| 2001/0047502 | A1* | 11/2001 | Hattori et al. | 714/777 |
| 2003/0061003 | A1* | 3/2003 | Miyauchi et al. | 702/181 |
| 2007/0260959 | A1* | 11/2007 | Sidi et al. | 714/755 |
| 2008/0240277 | A1* | 10/2008 | Anholt et al. | 375/262 |
| 2010/0322358 | A1* | 12/2010 | Drumm et al. | 375/341 |

* cited by examiner

*Primary Examiner* — Guy Lamarre
(74) *Attorney, Agent, or Firm* — Kilpatrick Townsend & Stockton LLP

(57) ABSTRACT

Systems, devices, and methods are disclosed herein using a pre-interleaving process to be performed at the transmitter. Data is rearranged at the transmitter, and the rearranged data is transmitted over the communication channel in an order that is more suitable for parallel processing at the decoder. Because processing at the transmitter is bit-wise rather than the multi-bit, soft-decision information at the decoder, pre-interleaving may reduce use system resources when compared to a re-interleaving process at the decoder.

19 Claims, 7 Drawing Sheets

PRE-INTERLEAVING FOR FORWARD ERROR CORRECTION CODES

CROSS REFERENCES TO RELATED APPLICATIONS

The present application claims benefit of priority under 35 U.S.C. 119(e) of U.S. Provisional Application No. 61/262,658, filed on Nov. 19, 2009, entitled "PRE-INTERLEAVING FOR FORWARD ERROR CORRECTION CODES," the entirety of which is herein incorporated by reference for all purposes.

BACKGROUND

Embodiments of the invention described herein generally relate to forward error correction (FEC) and, more specifically, to low-density parity-check (LDPC) encoding and decoding for satellite communications.

Forward error correction (FEC) is a method of transmitting redundant information with transmitted data to allow a receiver to reconstruct the data if there is an error in the transmission. At a transmitter, a structured redundancy may be added in the form of some parity bits by encoding the data. This structured redundancy may be exploited at the receiver by decoding to correct any errors introduced during transmission.

Some FEC coding schemes incorporate iterative decoding by a decoder. Turbo codes and low-density parity-check (LDPC) codes are examples of coding schemes that may be iteratively decoded. However, because of the complexity of these coding schemes, there may be significant memory and processing resources integrated into components at the receiver. There is, thus, a need in the art to improve aspects of the performance at the decoder.

One of the challenges in performing very high speed decoding for LDPC codes is moving lots of data in parallel in and out of memory. Because of the structure of the codes, usually all the data to be processed in a single clock cycle is not stored together in memory at the receiver. And so traditional decoders may rearrange the data inside the decoder in an order to facilitate highly parallel decoding. This rearrangement of data can be a tedious process and can add to the complexity and latency of the receiver.

SUMMARY

Systems, devices, and methods are disclosed herein using a novel pre-interleaving process to be performed at the transmitter. Data is rearranged at the transmitter, and the rearranged data is transmitted over the communication channel in an order that is more suitable for parallel processing at the decoder. Because processing at the transmitter is bit-wise rather than the multi-bit, soft-decision information at the decoder, pre-interleaving may reduce use of system resources when compared to a re-interleaving process at the decoder.

An example of a communications network according to the disclosure includes: a user terminal adapted to receive transmissions over a communication link; a gateway in communication with the user terminal and including: an ACM module adapted to determine a modulation and coding scheme for data representing content to be communicated to the user terminal, the data including information bits; an encoding module adapted to encode the data as a code block by applying the coding and modulation scheme, the code block including the information bits and parity bits arranged in a first order; a pre-interleaver module adapted to rearrange the code block such that the information bits and parity bits are arranged in a second order that is different from the first order; a channel interleaver module adapted to interleave the rearranged code block; and a modulator module adapted to modulate the information bits and parity bits of the channel interleaved code block as symbols by applying the coding and modulation scheme; and a transceiver module adapted to transmit the symbols to the user terminal over the communication link.

Embodiments of such a communications network may include one or more of the following features. The pre-interleaver module is adapted to rearrange at least some of the parity bits of the code block. The pre-interleaver module is adapted to rearrange at least some of the information bits of the code block. The encoding module is an LDPC encoder. The second order of the information bits and parity bits depends on a structure of an LDPC code of the LDPC encoder. The second order of the information bits and parity bits depends on a re-interleaving rearrangement of soft-decision information for parallel decoding at the user terminal. The communication link is a satellite communication link.

An example of a network access unit of a communications network configured to communicate with multiple user terminals adapted to receive transmissions over a satellite link includes: an ACM module adapted to determine a modulation and coding scheme for data representing content to be communicated to one or more user terminals, the data including information bits; an encoding module adapted to encode the data as a code block by applying the coding and modulation scheme, the code block including the information bits and parity bits arranged in a first order; a pre-interleaver module adapted to rearrange the code block such that the information bits and parity bits are arranged in a second order that is different from the first order; a channel interleaver module adapted to interleave the rearranged code block; and a modulator module adapted to modulate the information bits and parity bits of the channel interleaved code block by applying the coding and modulation scheme.

Embodiments of such a network access unit may include one or more of the following features. The pre-interleaver module is adapted to rearrange at least some of the parity bits of the code block. The pre-interleaver module is adapted to rearrange at least some of the information bits of the code block. The encoding module is an LDPC encoder. The second order of the information bits and parity bits depends on a structure of an LDPC code of the LDPC encoder. The second order of the information bits and parity bits depends on a re-interleaving rearrangement of soft-decision information for parallel decoding at the one or more user terminals.

An example of a method includes: receiving data representing content to be communicated to a user terminal, the data including information bits; determining a modulation and coding scheme for the data; encoding the data as a code block by applying the coding and modulation scheme, the code block including the information bits and parity bits arranged in a first order; rearranging the code block such that the information bits and parity bits are arranged in a second order that is different from the first order; channel interleaving the rearranged code block; modulating the information bits and parity bits of the channel interleaved code block as symbols by applying the coding and modulation scheme; and transmitting the symbols to the user terminal over a communication link, wherein the second order of the information bits and parity bits is determined to reduce rearrangement of soft-decision information for parallel decoding at the user terminal.

Embodiments of such a method may include one or more of the following features. Rearranging includes rearranging at least some of the parity bits of the code block. Rearranging includes rearranging at least some of the information bits of the code block. Encoding includes LDPC encoding. The second order of the information bits and parity bits is further determined by a structure of an LDPC code used for the LDPC encoding. Transmitting includes transmitting the symbols to the user terminal over a satellite communication link.

BRIEF DESCRIPTION OF THE DRAWINGS

A further understanding of the nature and advantages of the present invention may be realized by reference to the following drawings. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This description provides example embodiments only, and is not intended to limit the scope, applicability, or configuration of the invention. Rather, the ensuing description of the embodiments will provide those skilled in the art with an enabling description for implementing embodiments of the invention. Various changes may be made in the function and arrangement of elements without departing from the spirit and scope of the invention.

Thus, various embodiments may omit, substitute, or add various procedures or components as appropriate. For instance, it should be appreciated that in alternative embodiments the methods may be performed in an order different from that described, and that various steps may be added, omitted, or combined. Also, features described with respect to certain embodiments may be combined in various other embodiments. Different aspects and elements of the embodiments may be combined in a similar manner.

It should also be appreciated that the following systems, methods, and software may individually or collectively be components of a larger system, wherein other procedures may take precedence over or otherwise modify their application. Also, a number of steps may be required before, after, or concurrently with the following embodiments.

Systems, devices, methods, and software are described for pre-interleaving schemes for forward error correction codes. Example embodiments of novel device and system architectures are described herein with respect to LDPC codes and LDPC decoding. However, these may be adapted for other FEC coding schemes to facilitate parallel decoding.

Figure 1:
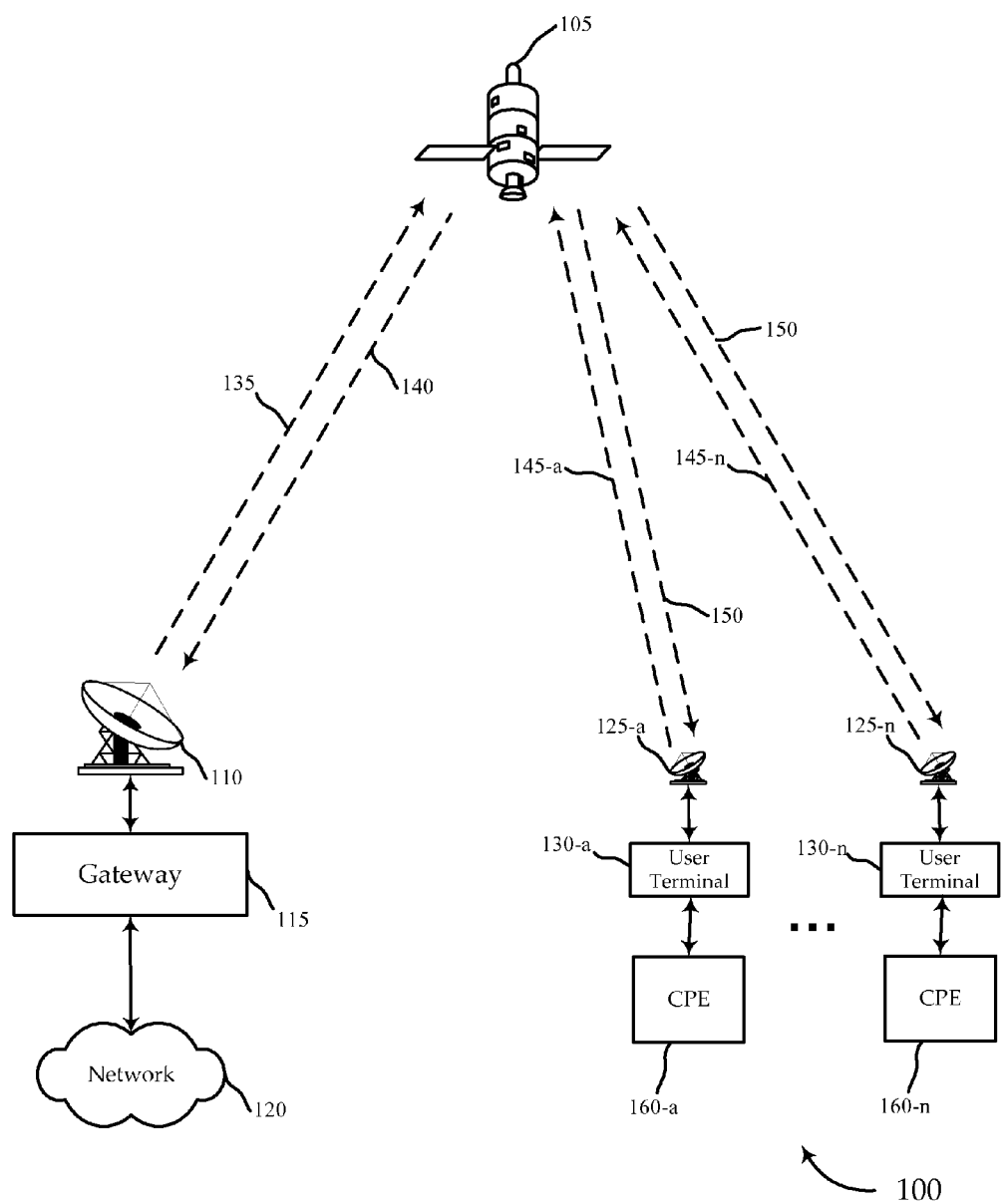
FIG. 1 is a simplified diagram of an example satellite communications system in which the methods and apparatuses of the present invention may be used.

LDPC and turbo codes are often used in satellite communications. Referring first to FIG. 1, a block diagram illustrates an example satellite communications system 100 configured according to various embodiments of the invention. While a satellite communications system is used to illustrate various aspects of the invention, it is worth noting that certain principles set forth herein are applicable to a number of other wireless systems, as well. The satellite communications system 100 includes a network 120, such as the Internet, interfaced with a gateway 115 that is configured to communicate with one or more user terminals 130, via a satellite 105.

The network 120 may be any type of network and can include, for example, the Internet, an IP network, an intranet, a wide-area network (WAN), a local-area network (LAN), a virtual private network (VPN), the Public Switched Telephone Network (PSTN), or any other type of network supporting data communication between any devices described herein. A network 120 may include both wired and wireless connections, including optical links. Many other examples are possible and apparent to those skilled in the art in light of this disclosure. The network 120 may connect the gateway 115 with other gateways (not pictured), which are also in communication with the satellite 105, and which may share information on link conditions and other network metrics.

The gateway 115 provides an interface between the network 120 and the user terminal 130. The gateway 115 may be configured to receive data and information directed to one or more user terminals 130, and format the data and signaling information for delivery downstream to the respective user terminals 130 via the satellite 105. In some embodiments, the gateway 115 may encode data to be transmitted downstream using LDPC codes. The encoded data may be pre-interleaved at the gateway 115 according to the various techniques described herein.

The gateway 115 may also be configured to receive upstream signals from the satellite 105 (e.g., from one or more user terminals 130) directed to a destination in the network 120, and can format the received signals for transmission through the network 120. The novel LDPC coding techniques herein are, in many instances, described with reference to encoding and transmission at the gateway 115, and reception and decoding at the user terminal 130. However, in other embodiments, the LDPC coding techniques herein may include encoding and transmission at the user terminal 130, and reception and decoding at the gateway 115 (star) or user terminal 130 (mesh).

A device (not shown) connected to the network 120 may communicate with one or more user terminals 130 through the gateway 115. Data packets may be sent from a device in the network 120 to the gateway 115. The gateway 115 may format a series of frames in accordance with a physical layer definition for transmission to the satellite 105 via a downstream link 135. A variety of physical layer transmission modulation and coding techniques may be used with certain embodiments of the invention, including those defined with the DVB-S2 and WiMAX standards. In a number of embodiments, the gateway 115 utilizes ACM in conjunction with one or more of the traffic control and shaping techniques described herein to direct traffic to the individual terminals. The gateway 115 may use a broadcast signal, with a modulation and coding (modcode) format adapted for each packet to the link conditions of the user terminal 130 or set of user terminals 130 to which the packet is directed (e.g., to account for the variable service link 150 conditions from the satellite 105 to each respective user terminal 130).

The gateway 115 may use an antenna 110 to transmit the signal to the satellite 105. In one embodiment, the antenna 110 is a parabolic reflector with high directivity in the direction of the satellite and low directivity in other directions. The downstream signals 135, 150 may include, for example, one (or more) single carrier signals. Each single carrier signal may be divided in time (e.g., using Time-Division Multiple Access (TDMA) or other time-division multiplexing techniques) into a number of sub-channels. The sub-channels may be the same size, or different sizes, and a range of options will be addressed below. In some embodiments, other channelization schemes may be integrated with or used in place of time-divided sub-channels, such as Frequency-Division Multiple Access (FDMA), Orthogonal Frequency-Division Multiple Access (OFDMA), Code-Division Multiple Access (CDMA), or any number of hybrid or other schemes known in the art.

In one embodiment, a geostationary satellite 105 is configured to receive the signals from the location of antenna 110 and within the frequency band and specific polarization transmitted. The satellite 105 may, for example, use a reflector antenna, lens antenna, array antenna, active antenna, or other mechanism known in the art for reception and/or transmission of signals. The satellite 105 may process the signals received from the gateway 115 and transmit the signal from the gateway 115 to one or more user terminals 130. In one embodiment, the satellite 105 operates in a multi-beam mode, transmitting a number of narrow beams, each directed at a different region of the earth, allowing for frequency re-use. With such a multi-beam satellite 105, there may be any number of different signal switching configurations on the satellite 105, allowing signals from a single gateway 115 to be switched between different spot beams. In one embodiment, the satellite 105 may be configured as a "bent pipe" satellite, wherein the satellite 105 may frequency-convert the received carrier signals before retransmitting these signals to their destination, but otherwise perform little or no other processing on the contents of the signals. A variety of physical layer transmission modulation and coding techniques may be used by the satellite 105 in accordance with certain embodiments of the invention, including those defined with the DVB-S2 and WiMAX standards. For other embodiments, a number of configurations are possible (e.g., using LEO satellites, or using a mesh network instead of a star network), as evident to those skilled in the art.

The service signals transmitted from the satellite 105 may be received by one or more user terminals 130, via the respective user antenna 125. In one embodiment, the antenna 125 and user terminal 130 together make up a very small aperture terminal (VSAT). In other embodiments, a variety of other types of antennas 125 may be used at the user terminal 130 to receive the signal from the satellite 105. The user terminals 130 may include decoders to decode the LDPC encoded data. Each of the user terminals 130 may be a single user terminal 130 or, alternatively, be a hub or router (not pictured) that is coupled with multiple user terminals 130. Each user terminal 130 may be connected to consumer premises equipment (CPE) 160 (e.g., computers, local area networks, Internet appliances, wireless networks, etc.).

In one embodiment, a Multi-Frequency Time-Division Multiple Access (MF-TDMA) scheme is used for upstream links 140, 145, allowing efficient streaming of traffic while maintaining flexibility in allocating capacity among each of the user terminals 130. In this embodiment, a number of frequency channels are allocated which may be fixed, or which may be allocated in a more dynamic fashion. A TDMA scheme is then employed in each frequency channel. In this scheme, each frequency channel may be divided into several timeslots that can be assigned to a connection (i.e., a user terminal 130). In other embodiments, one or more of the upstream links 140, 145 may be configured with other schemes, such as TDMA, FDMA, OFDMA, CDMA, or any number of hybrid or other schemes known in the art.

A user terminal 130 may transmit information related to signal quality to the gateway 115 via the satellite 105. The signal quality may be a measured signal-to-noise ratio, an estimated signal-to-noise ratio, a bit error rate, a received power level, or any other communication link quality indicator. The user terminal 130 itself may measure or estimate the signal quality, or it may pass information measured or estimated by other devices. The user terminal 130 may specify a modcode to be used for transmission by the gateway 115 to the user terminal 130, or to the set of user terminals 130 near the user terminal 130. A user terminal 130 may also transmit data and information to a network 120 destination via the satellite 105 and gateway 115. The user terminal 130 transmits the signals via the upstream uplink 145 to the satellite 105 using the antenna 125. A user terminal 130 may transmit the signals according to a variety of physical layer transmission modulation and coding techniques, including those defined with the DVB-S2 and WiMAX standards. In various embodiments, the physical layer techniques may be the same for each of the links 135, 140, 145, 150, or may be different. The gateway 115 may, in some embodiments, use this signal quality information to implement ACM, adjusting the modcode formats to each user terminal 130 or set of user terminals 130 based on their link conditions. Thus, the gateway 115 may adapt the code rate of the LDPC codes for data to be transmitted downstream to user terminals 130.

Turning now to the use of LDPC codes in the described satellite network 100, the concept of LDPC codes may be generalized to all the linear block codes that can be represented by a sparse parity check matrix. These codes may be decoded using iterative soft-input soft-output (SISO) decoding. It may be desirable to reduce the inherent latency of the iterative process to facilitate the processing of high-data rate communications. An iteration involves two processing stages—check node processing and bit node processing. During the check node processing stage, extrinsic information and parity bits involved in a parity check equation are gathered and new extrinsic information is calculated for all the related bits. During the bit node processing stage, the extrinsic information corresponding to the several parity check equations for any bit is combined to provide updated output information for the next iteration. In general, the information and parity bits may be referred to as bit nodes, and the parity check equations may be referred to as check nodes. The parity check matrix can be considered as an interconnection network between bit nodes and check nodes, and every connection is defined as an edge. During the iterative decoding process, every edge carries extrinsic information back and forth between the bit nodes and check nodes.

Figure 2:
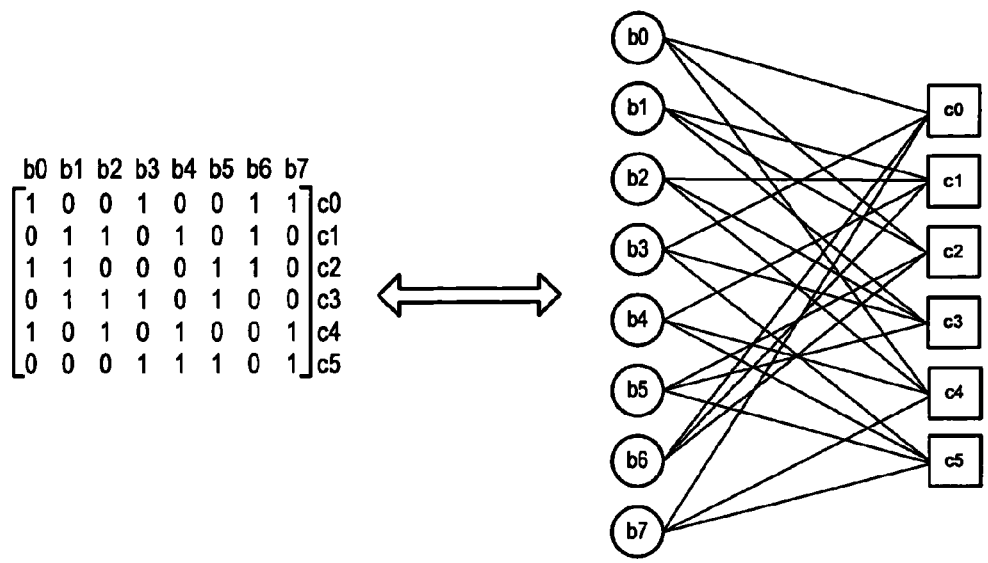
FIG. 2 is an example parity check matrix and an associated bipartite graph.

FIG. 2 is an example parity check matrix A and an associated bipartite graph. In the bipartite graph, each bit node b0-b7 represents a corresponding column in the parity check matrix A, and each check node c0-c5 represents a corresponding row in the parity check matrix A. The example parity check A is not an actual LDPC parity check matrix, and is provided for illustrative purposes only. Each "1" represents a bit involved in a parity check. Thus, for each code word $a=[a_0, a_1, \ldots a_7]$ received, the parity checks are based on:

$$a_0+a_3+a_6+a_7,$$

$$a_1+a_2+a_4+a_6, \ldots$$

etc. The received code word may be represented by soft information, the values of which may be used to initialize a matrix according to the parity check matrix A for iterative decoding. For example, if the soft information generated from a received code word is [0.22, 0.17, 0.78, 0.80, 0.87, 0.10, 0.25, 0.33], then an initialized matrix X according to the parity check matrix of FIG. 2 would be:

$$\begin{bmatrix} 0.22 & & & 0.80 & & & 0.25 & 0.33 \\ & 0.17 & 0.78 & & 0.87 & & 0.25 & \\ 0.22 & 0.17 & & & & 0.10 & 0.25 & \\ & 0.17 & 0.78 & 0.80 & & 0.10 & & \\ 0.22 & & 0.78 & & 0.87 & & & 0.33 \\ & & & 0.80 & 0.87 & 0.10 & & 0.33 \end{bmatrix}$$

Each connection between a bit node and a check node is an edge, and corresponds to a "1" in the parity check matrix A. Because the parity check matrix A has a column weight of 3 and a row weight of 4, each bit node is connected to three edges and each check node is connected to four edges. During the iterative decoding process, each check node provides a bit node estimate to a bit node based on information from other related bit nodes. The bit nodes, in return, provide an estimate of its own value based on information from other related check nodes. The process continues until all parity check equations are satisfied, indicating a valid decode, or until a maximum number of iterations is reached without satisfying all parity check equations, indicating a decoding failure.

During decoding, a value may be assigned to each edge of a bipartite graph that is representative of a channel value associated with a bit node to which the edge is connected. Check nodes are then updated by accumulating the edge values according to a log-likelihood operation G:

$$G(a, b) = \ln\frac{1 + e^{a+b}}{e^a + e^b}$$

Bit nodes may thereafter be updated with the update edge values by summing the edge values associated with the bit node. Thereafter, the system determines if all parity equations are satisfied or if a maximum number of iterations has been reached if all parity equations are not satisfied.

The interconnection between the bit nodes and check nodes in an LDPC code is typically pseudo-random. To facilitate high-speed decoding with reasonable complexity, a structure is often imparted in the code design so that the connections to the check nodes for a group of bit nodes are a linear translation of each other, i.e., some or all of the parity equations may be a linear translation of one particular parity equation. For example, a parity check matrix may define the following sets of linearly shifted parity check equations (1) and (2):

$$a_0 + a_8 + a_{16} + a_{32} = 0,$$

$$a_1 + a_9 + a_{17} + a_{33} = 0,$$

$$a_2 + a_{10} + a_{18} + a_{34} = 0 \quad (1)$$

$$a_0 + a_{10} + a_{20} + a_{30} = 0,$$

$$a_1 + a_{11} + a_{21} + a_{31} = 0,$$

$$a_2 + a_{12} + a_{22} + a_{32} = 0 \quad (2)$$

etc. Thus in the linearly shifted parity check equation (1), operands $a_0$, $a_1$, and $a_2$ correspond to the first operand $a_p$, operands $a_8$, $a_9$, and $a_{10}$ correspond to the second operand $a_{p+8}$, and so on. Such a code structure facilitates parallelizing the decoding process.

Memory size and access can present unique implementation challenges. Multiple bits of soft-extrinsic information for all the edges between bit nodes and check nodes must be accommodated and stored. The memory for storing such information is often referred to as edge memory. Additionally, during the iterative decoding process, the bit node processors may require the original soft-input from the channel. The size of the memory depends on the block size, the resolution of soft-information, and also the average number of edges per bit, and may be relatively large for large block code sizes. Additionally, a highly-parallel decoder will read from and write to memory stores in a highly-parallel fashion. Thus, for a degree of parallelism "p" the decoder may read and write p blocks of information at a time from these memories. For example, the sets of linearly shifted parity check equations (1) and (2) above define a first degree of parallelism p and a second degree of parallelism p. The values of p may differ for each degree of parallelism, e.g., the first degree of parallelism p may be 8, and the second degree of parallelism may be 16. The values of p may also be the same for some or all degrees of parallelism.

As illustrated above, powerful LDPC codes are based on complex interconnection of the bit nodes and check nodes, so gathering the data to perform highly parallel check node processing and bit node processing operations is a design challenge for efficient decoder implementation. To make high-speed decoding practicable with current designs, the data going into the decoder may need to be rearranged such that the decoder can get to the useful data in a highly-parallel fashion. Traditionally, this rearrangement of data takes place at the decoder to facilitate parallel processing and decoding. When performed at the decoder, this process may be referred to as re-interleaving in this specification. The following description provides a novel alternative system architecture.

Figure 3:
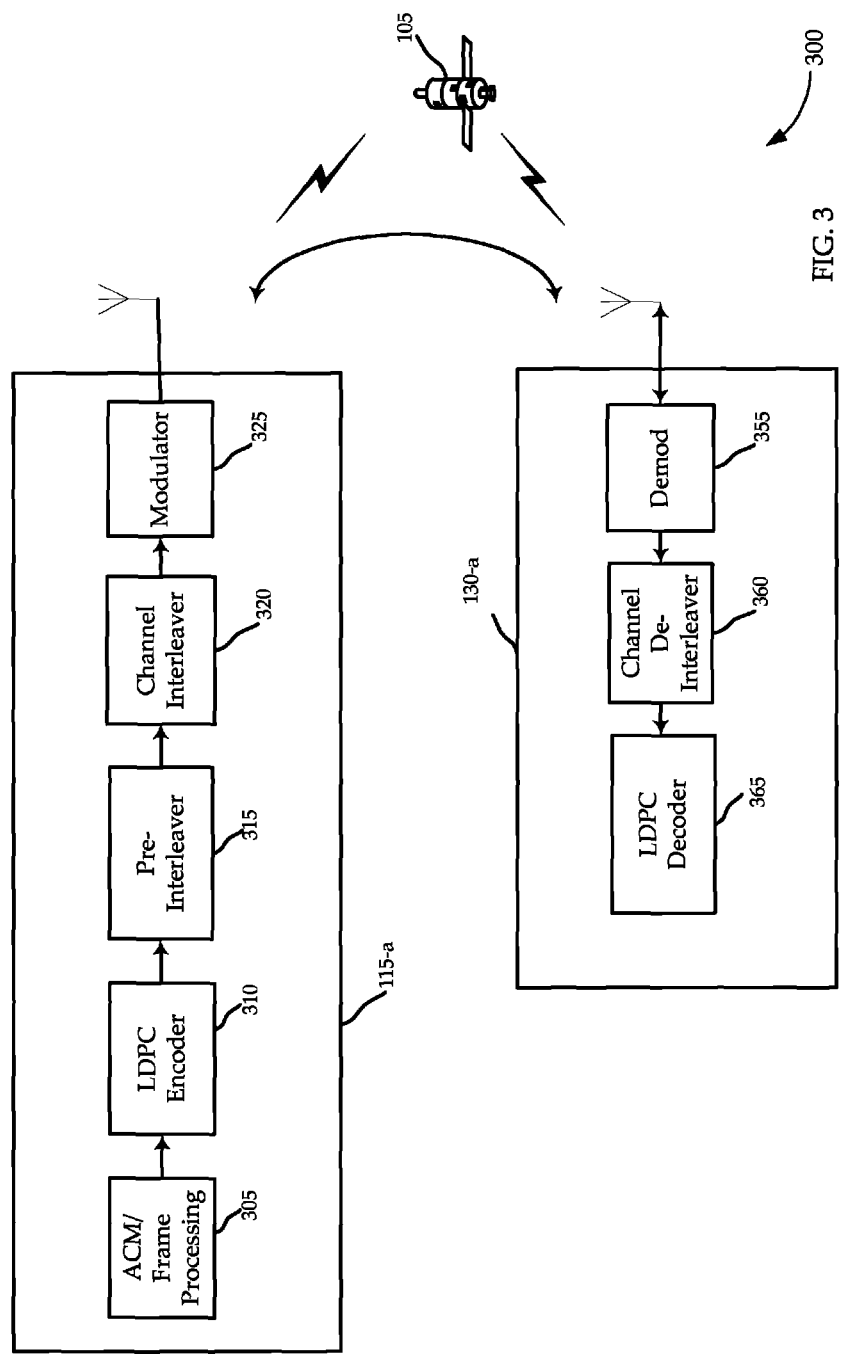
FIG. 3 is a block diagram of an example configuration of a device of the satellite communications system 100 of FIG. 1.

Referring to FIG. 3, a block diagram is shown illustrating an example configuration 300 for certain devices of the satellite communications system 100 of FIG. 1. While the example configuration illustrates communication between a gateway 115-a and a terminal 130-a, those skilled in the art will recognize that similar components may be used between other links for the same or other types of terminals, or between a satellite and a terminal.

In one embodiment, an initiating terminal (not shown) transmits data via a network (e.g. network 120) to the gateway 115-a for transmission downstream. The data is received by the gateway 115-a. The received data may, for example, be a series of IP packets. The gateway 115-a is made up of an ACM/frame processing module 305, an LDPC encoder module 310, a pre-interleaver module 315, a channel interleaver module 320, and a modulator module 325. These components (305-325) may be implemented, in whole or in part, in hardware. Thus, they may be made up of one, or more, Application Specific Integrated Circuits (ASICs) adapted to perform a subset of the applicable functions in hardware. Alternatively, the functions may be performed by one or more other processing units (or cores), on one or more integrated circuits. In other embodiments, other types of integrated circuits may be used (e.g., Structured/Platform ASICs, Field Programmable Gate Arrays (FPGAs), and other Semi-Custom ICs), which may be programmed in any manner known in the art. Each may also be implemented, in whole or in part, with instructions embodied in a computer-readable medium, formatted to be executed by one or more general or application specific processors. Thus, the device 300 may include different types and configurations of memory (not shown), which may be integrated into the hardware or may be one or more separate components.

After some intermediate processing by other components (not shown) of the gateway 115-a, the data may be received by the ACM/frame processing module 305. The ACM/frame processing module 305 may identify, for each of the packets of the stream, a modulation and coding format from a number of different modulation and coding formats. The identified modcode format may be based on the link condition associated with a destination for each respective packet.

ACM/frame processing module 305 may also define a series of frames. These may be frames defined according to the DVB-S2 framing format. Thus, the frames may each include a physical layer header to be transmitted at a very robust code rate. The physical layer header may include a unique word and signaling information. The payload for each frame may be encoded using LDPC codes at the adapted code rate (based on, for example, the link condition for the destination terminal or the type of programming).

Figure 4:
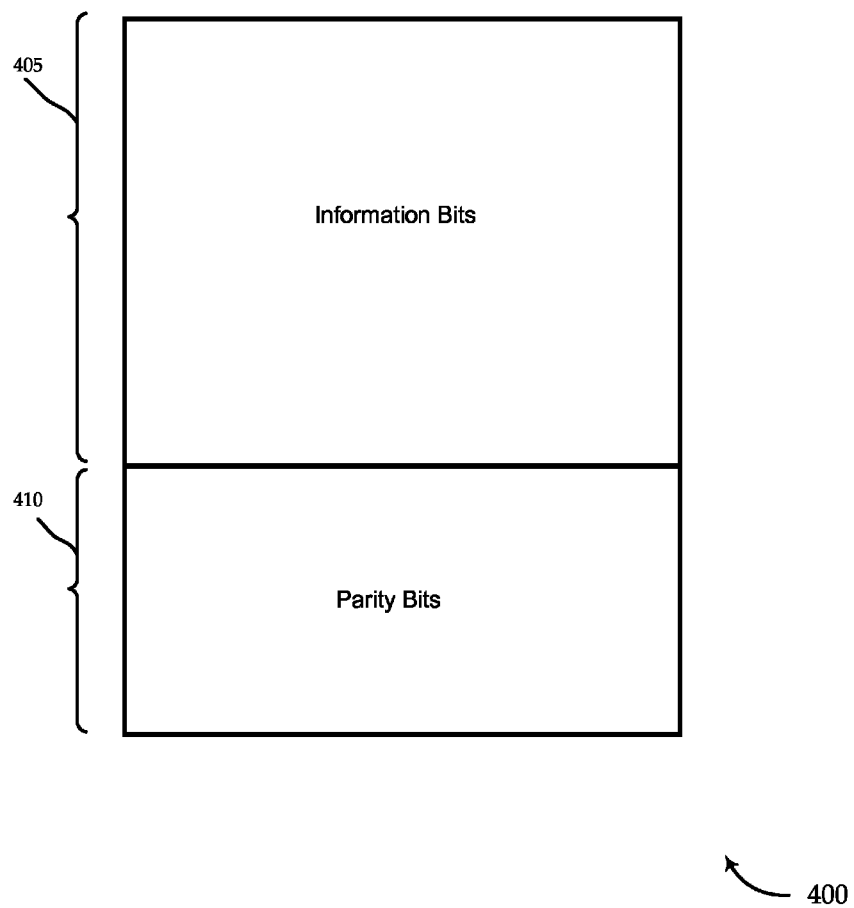
FIG. 4 is a block diagram of an example LDPC block.

Therefore, the ACM/frame processing module 305 may set the payload size and code rate for each frame, and thus determine the amount of information that is to be forwarded to the LDPC encoder module 310 for encoding for each frame. Turning briefly to FIG. 4, a block diagram illustrates an example LDPC block 400 for a frame. As noted, once the payload size and code rate are known for a frame, a block size for the information bits 405 is known. ACM/frame processing module 305 may forward the information bits 405 to the LDPC encoder module 310. The LDPC encoder module 310 may then generate a set of parity bits 410 (e.g., according to the code rate and the DVB-S2 specification). Together, information bits 405 and parity bits 410 may make up the LDPC block 400 for a given frame. It is worth noting that in typical prior art systems the information bits 405 and parity bits 410 are then simply transferred as a block to a channel interleaver for interleaving before being transferred.

Turning back to FIG. 3, the LDPC encoder 310 may forward the LDPC block 400 for a given frame to the pre-interleaver module 315. Recall that to provide for efficient high speed decoding, the parity bits 410 going into the decoder need to be rearranged such that the decoder can get to the useful data in a highly-parallel fashion. While this rearrangement traditionally may occur at the receiver, at least a portion of this rearrangement may occur at the pre-interleaver module 315 in these embodiments. Note that the specific rearrangement is dependent upon the structure of the particular LDPC code being used. All, or only a subset, of the parity bits 410 may be rearranged. In addition, the rearrangement need not be complete (i.e., the rearrangement may simply be an intermediate step requiring additional rearrangement at the decoder, but facilitating less rearrangement at the decoder than would otherwise be required, and thereby decreasing processing and latency). In some embodiments, the rearrangement of parity bits 410 is the same or similar as the rearrangement in re-interleaving process, but the pre-interleaver module 315 needs to work on just bits (no soft-decision) and so requires less memory. Thus, the overall system-memory needed for this process may be reduced substantially. Also, given that processing is performed on just bits, there may be reduced congestion and latency issues for high-speed implementations. Finally, it is worth noting that while the described rearrangement by the pre-interleaver module 315 is for parity bits 410, the rearrangement may also occur for information bits 405.

The pre-interleaver module 315 may then forward the rearranged LDPC block 400 to a channel interleaver module 320 for interleaving. The channel interleaver module 320 may perform intra-block interleaving and/or inter-block interleaving, based on channel characteristics. This channel interleaving may be based on any one of a number of traditional interleaving schemes known in the art. The channel interleaver module 320 may then forward the frame with the payload to be processed by the modulator module 325 for modulation (according to the assigned modulation format and DVB-S2 specification) and transmission via a wireless signal through the satellite 105 to the user terminal 130-a.

At the user terminal 130-a, the transmitted signal is received. The user terminal 130-a in this embodiment is made up of a demodulator module 355, channel de-interleaver module 360, and LDPC decoder module 365. The demodulator module 355 may downconvert, amplify, and demodulate the signal, thereby producing a soft-information version of the interleaved LDPC block (i.e., the block that was forwarded by the channel interleaver module 320 to the modulator module 325). This is then forwarded to the channel de-interleaver module 360, wherein the block (or blocks) are de-interleaved, thereby producing a soft-information version of the rearranged LDPC block (i.e., the block that was forwarded by the pre-interleaver module 315 to the channel interleaver module 320). The channel de-interleaver module 360 may forward the rearranged LDPC block 400 to the LDPC decoder 365. Because the LDPC block 400 was rearranged (at least in part) at the transmitter to facilitate high-speed, parallel decoding, the processing and associated latency at the LDPC decoder 365 may be lessened.

Figure 5:
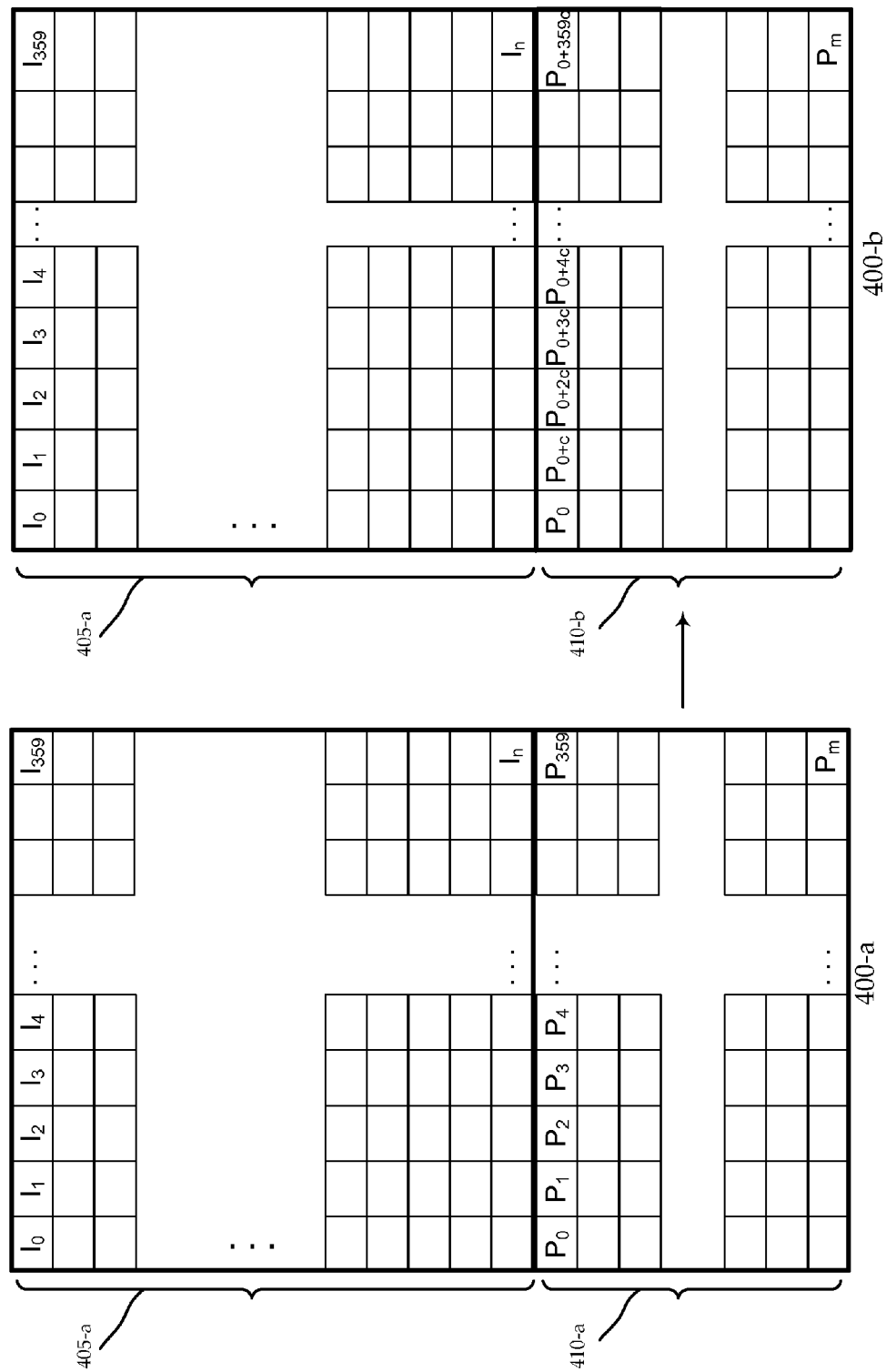
FIG. 5 is a block diagram of an example rearrangement for an LDPC block.

Turning next to FIG. 5, a block diagram 500 illustrates a more specific example rearrangement for an LDPC block, which may be performed at the pre-interleaver 315 of FIG. 3. FIG. 5 illustrates a first LDPC block 400-a that includes a number of rows of information bits 405-a and parity bits 410-a. This is an example of a block that may be produced by the LDPC encoder 310 of FIG. 3, and forwarded to the pre-interleaver 315 of FIG. 3. In this example, there are 360 bits per row.

Figure 6:
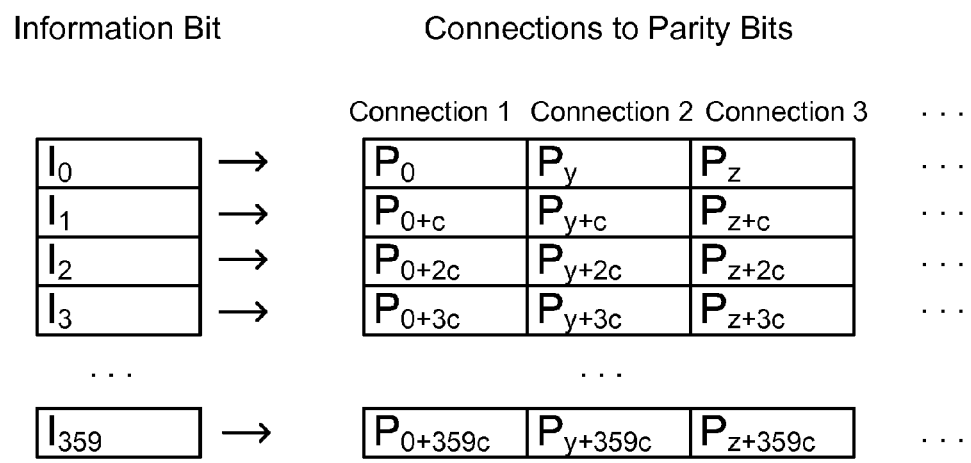
FIG. 6 is a chart of example connections between information bits and parity bits.

Turning briefly to FIG. 6, a chart 600 illustrates the connections between information bits and parity bits. In a first set of connections: information bit $I_0$ may be connected to parity bit $P_0$, information bit $I_1$ may be connected to parity bit $P_{0+c}$, information bit $I_2$ may be connected to parity bit $P_{0+2c}$, and so on. All or some of the information bits in the first row (e.g., $I_0$-$I_{359}$) may be accessed in parallel—however, the connected parity bits may be dispersed throughout the parity block (e.g., block 410-a). Thus, some rearrangement may be needed to facilitate parallel access and processing of the associated parity bits for that row.

Turning back to FIG. 5, a second, rearranged LDPC block 400-b includes the number of rows of information bits 405-a and a rearranged set of parity bits 410-b. The rearrangement of 410-a to 410-b may be performed by the pre-interleaver module 315. As is illustrated, there may be access for parallel processing to all or part of the first row of information bits 405-a by an LDPC decoder (e.g., LDPC decoder 365), and then access for parallel processing to all or part of the first row of rearranged bits 410-b without additional rearrangement at the decoder.

It must be emphasized that the rearrangement described with reference to the pre-interleaver module 315 of FIG. 3, and the rearrangement of parity bits of FIGS. 5 and 6, is for purposes of example only. It is again worth noting that the specific rearrangement is dependent upon the structure of the particular LDPC code being used. All, or only a subset, of the parity bits may be rearranged. In addition, the rearrangement need not be complete (i.e., the rearrangement may simply be an intermediate step requiring additional rearrangement at the decoder, but facilitating less rearrangement at the decoder than would otherwise be required, and thereby decrease processing and latency). In some embodiments, the rearrangement of parity bits 410 is the same or similar as the rearrangement in the re-interleaving process, but the pre-interleaver module 315 needs to work on just bits (no soft-decision) and so requires less memory. Thus, the overall system-memory needed for this process can be reduced. Also given that processing is performed on just bits, there may be reduced congestion and latency issues for high-speed implementations. Finally, it is worth noting that the rearrangement may also occur for information bits, alone or in combination with parity bit rearrangement.

Figure 7:
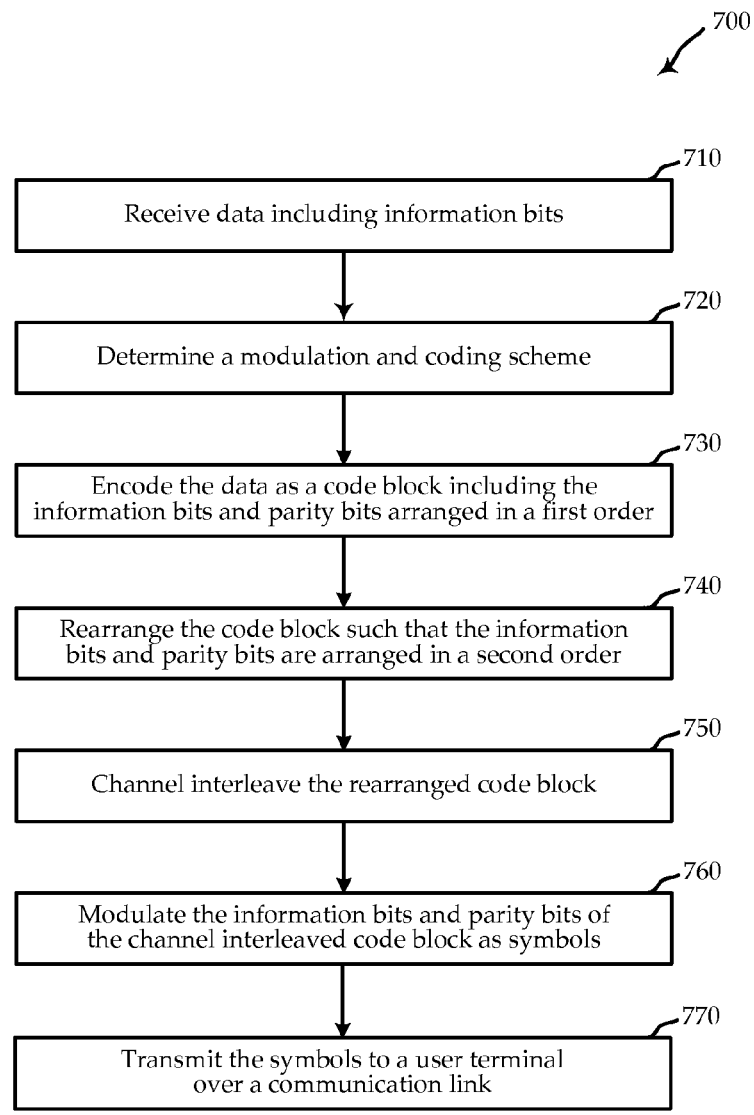
FIG. 7 is a flow diagram illustrating an example method for communicating data utilizing pre-interleaving.

The features of the various embodiments of FIGS. 3 and 5 may be implemented in a number of ways according to the specification. Further, the components and functionalities in those figures may be used to perform a number of different methods according to the specification. FIG. 7 provides a flow diagram illustrating an example method for communicating data utilizing pre-interleaving.

The method 700 may begin at block 710 by receiving data representing content to be communicated to a user terminal, where the data includes information bits. The data may be any type of data, for example audio-visual data.

A modulation and coding scheme for the data may be determined at block 720. For example, for each data packet, a modcode can be adapted (e.g., by the ACM/frame processing module 305) for each packet to the link condition of the user terminal to which the packet is directed.

At block 730, the data is encoded as a code block by applying the coding and modulation scheme. The code block includes the information bits and parity bits arranged in a first order. In some implementations, the encoding includes LDPC encoding by an LDPC encoder 310. In one example, the bits can be arranged as in the LDPC block 400-*a* that includes a number of rows of information bits 405-*a* and parity bits 410-*a*.

At block 740 the code block is rearranged such that the information bits and parity bits are arranged in a second order that is different from the first order. The rearranging can be performed by a pre-interleaver 315. As an example, the LDPC block 400-*a* can be rearranged as LDPC block 400-*b*, which includes the rows of information bits 405-*a* and a rearranged set of parity bits 410-*b*. There may be access for parallel processing to all or part of the first row of information bits 405-*a* by an LDPC decoder (e.g., LDPC decoder 365), and then access for parallel processing to all or part of the first row of rearranged bits 410-*b* without additional rearrangement at the decoder.

In some implementations, at least some of the parity bits of the code block are rearranged. In some implementations, at least some of the information bits of the code block are rearranged. The second order of the bits can be determined to reduce rearrangement of soft-decision information for parallel decoding at the user terminal. In one example, the second order is determined by a structure of an LDPC code used for the LDPC encoding.

At block 750, the rearranged code block is channel interleaved. For example, the channel interleaver module 320 may perform intra-block interleaving and/or inter-block interleaving, based on channel characteristics.

At block 760, the information bits and parity bits of the channel interleaved code block are modulated as symbols by applying the coding and modulation scheme. For example, the modulator module 325 can modulate the bits according to the assigned modulation format and DVB-S2 specification.

At block 770, the symbols are transmitted to the user terminal over a communication link. In some implementations, the transmission is via a wireless signal through the satellite 105 to the user terminal 130-*a*.

It should be noted that the methods, systems, and devices discussed above are intended merely to be examples. It must be stressed that various embodiments may omit, substitute, or add various procedures or components as appropriate. For instance, it should be appreciated that, in alternative embodiments, the methods may be performed in an order different from that described, and that various steps may be added, omitted, or combined. Also, features described with respect to certain embodiments may be combined in various other embodiments. Different aspects and elements of the embodiments may be combined in a similar manner. Also, it should be emphasized that technology evolves and, thus, many of the elements are examples and should not be interpreted to limit the scope of the invention.

Specific details are given in the description to provide a thorough understanding of the embodiments. However, it will be understood by one of ordinary skill in the art that the embodiments may be practiced without these specific details. For example, well-known circuits, processes, algorithms, structures, and techniques have been shown without unnecessary detail in order to avoid obscuring the embodiments.

Also, it is noted that the embodiments may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Moreover, as disclosed herein, the term "memory" or "memory unit" may represent one or more devices for storing data, including read-only memory (ROM), random access memory (RAM), magnetic RAM, core memory, magnetic disk storage mediums, optical storage mediums, flash memory devices, or other computer-readable mediums for storing information. The term "computer-readable medium" includes, but is not limited to, portable or fixed storage devices, optical storage devices, wireless channels, a sim card, other smart cards, and various other mediums capable of storing, containing, or carrying instructions or data.

Furthermore, embodiments may be implemented by hardware, software, firmware, middleware, microcode, hardware description languages, or any combination thereof. When implemented in software, firmware, middleware, or microcode, the program code or code segments to perform the necessary tasks may be stored in a computer-readable medium such as a storage medium. Processors may perform the necessary tasks.

Having described several embodiments, it will be recognized by those of skill in the art that various modifications, alternative constructions, and equivalents may be used without departing from the spirit of the invention. For example, the above elements may merely be a component of a larger system, wherein other rules may take precedence over or otherwise modify the application of the invention. Also, a number of steps may be undertaken before, during, or after the above elements are considered. Accordingly, the above description should not be taken as limiting the scope of the invention.

What is claimed is:

1. A communications network comprising:
a user terminal adapted to receive transmissions over a communication link;
a gateway in communication with the user terminal and comprising:
an adaptive coding and modulation (ACM) module adapted to determine a modulation and coding scheme for data representing content to be communicated to the user terminal, the data including information bits;
an encoding module adapted to encode the data as a code block by applying the coding and modulation scheme, the code block including the information bits and parity bits arranged in a first order;
a pre-interleaver module adapted to rearrange the code block into a rearranged code block such that the information bits and parity bits are arranged in a second order that is different from the first order;
a channel interleaver module adapted to interleave the rearranged code block from the pre-interleaver module; and
a modulator module adapted to modulate the information bits and parity bits of the channel interleaved code block as symbols by applying the coding and modulation scheme; and
a transceiver module adapted to transmit the symbols to the user terminal over the communication link.

2. The communications network of claim 1, wherein the pre-interleaver module is adapted to rearrange at least some of the parity bits of the code block.

3. The communications network of claim 1, wherein the pre-interleaver module is adapted to rearrange at least some of the information bits of the code block.

4. The communications network of claim 1, wherein the encoding module is an LDPC encoder.

5. The communications network of claim 4, wherein the second order of the information bits and parity bits depends on a structure of an LDPC code of the LDPC encoder.

6. The communications network of claim 1, wherein the second order of the information bits and parity bits depends on a re-interleaving rearrangement of soft-decision information for parallel decoding at the user terminal.

7. The communications network of claim 1, wherein the communication link is a satellite communication link.

8. A network access unit of a communications network configured to communicate with a plurality of user terminals adapted to receive transmissions over a satellite link, the network access unit comprising:
an adaptive coding and modulation (ACM) module adapted to determine a modulation and coding scheme for data representing content to be communicated to one or more user terminals, the data including information bits;
an encoding module adapted to encode the data as a code block by applying the coding and modulation scheme, the code block including the information bits and parity bits arranged in a first order;
a pre-interleaver module adapted to rearrange the code block into a rearranged code block such that the information bits and parity bits are arranged in a second order that is different from the first order;
a channel interleaver module adapted to interleave the rearranged code block from the pre-interleaver module; and
a modulator module adapted to modulate the information bits and parity bits of the channel interleaved code block by applying the coding and modulation scheme.

9. The network access unit of claim 8, wherein the pre-interleaver module is adapted to rearrange at least some of the parity bits of the code block.

10. The network access unit of claim 8, wherein the pre-interleaver module is adapted to rearrange at least some of the information bits of the code block.

11. The network access unit of claim 8, wherein the encoding module is an LDPC encoder.

12. The network access unit of claim 11, wherein the second order of the information bits and parity bits depends on a structure of an LDPC code of the LDPC encoder.

13. The network access unit of claim 8, wherein the second order of the information bits and parity bits depends on a re-interleaving rearrangement of soft-decision information for parallel decoding at the one or more user terminals.

14. A method comprising:
receiving data representing content to be communicated to a user terminal, the data including information bits;
determining a modulation and coding scheme for the data;
encoding the data as a code block by applying the coding and modulation scheme, the code block including the information bits and parity bits arranged in a first order;
rearranging the code block into a rearranged code block such that the information bits and parity bits are arranged in a second order that is different from the first order;
channel interleaving the rearranged code block;
modulating the information bits and parity bits of the channel interleaved code block as symbols by applying the coding and modulation scheme; and
transmitting the symbols to the user terminal over a communication link, wherein the second order of the information bits and parity bits is determined to reduce rearrangement of soft-decision information for parallel decoding at the user terminal.

15. The method of claim 14, wherein rearranging comprises rearranging at least some of the parity bits of the code block.

16. The method of claim 14, wherein rearranging comprises rearranging at least some of the information bits of the code block.

17. The method of claim 14, wherein encoding comprises LDPC encoding.

18. The method of claim 17, wherein the second order of the information bits and parity bits is further determined by a structure of an LDPC code used for the LDPC encoding.

19. The method of claim 14, wherein transmitting comprises transmitting the symbols to the user terminal over a satellite communication link.

* * * * *